United States Patent
Li et al.

(10) Patent No.: US 9,444,067 B2
(45) Date of Patent: Sep. 13, 2016

(54) ORGANIC LIGHT-EMITTING DIODE FLUORESCENT DEVICE AND METHOD FOR PRODUCING SAME

(71) Applicant: EverDisplay Optronics (Shanghai) Limited, Shanghai (CN)

(72) Inventors: Yanhu Li, Shanghai (CN); Hsin Chih Lin, Shanghai (CN)

(73) Assignee: EverDisplay Optronics (Shanghai) Ltd., Shanghai (CN)

( * ) Notice: Subject to any disclaimer, the term of this patent is extended or adjusted under 35 U.S.C. 154(b) by 0 days.

(21) Appl. No.: 14/600,248

(22) Filed: Jan. 20, 2015

(65) Prior Publication Data

US 2016/0133866 A1 May 12, 2016

(30) Foreign Application Priority Data

Nov. 6, 2014 (CN) .......................... 2014 1 0621109

(51) Int. Cl.
*H01L 51/50* (2006.01)
*H01L 51/56* (2006.01)
*H01L 51/00* (2006.01)

(52) U.S. Cl.
CPC ....... *H01L 51/5056* (2013.01); *H01L 51/5012* (2013.01); *H01L 51/5072* (2013.01); *H01L 51/5088* (2013.01); *H01L 51/5092* (2013.01); *H01L 51/56* (2013.01); *H01L 51/0061* (2013.01); *H01L 51/0072* (2013.01); *H01L 51/0073* (2013.01)

(58) Field of Classification Search
CPC ........... H01L 51/0059; H01L 51/0072; H01L 51/5016; H01L 2251/5384
See application file for complete search history.

(56) References Cited

U.S. PATENT DOCUMENTS

| 7,037,599 | B2 * | 5/2006 | Culligan | C09K 11/06 257/40 |
| 7,597,967 | B2 * | 10/2009 | Kondakova | C09K 11/06 313/504 |
| 8,343,636 | B2 * | 1/2013 | Jen | C08G 61/124 257/40 |
| 8,415,473 | B2 * | 4/2013 | Yam | H01L 51/0091 313/504 |
| 8,803,420 | B2 * | 8/2014 | Kawamura | C09K 11/06 257/40 |
| 9,153,790 | B2 * | 10/2015 | Kuma | H01L 51/5016 |
| 9,299,942 | B2 * | 3/2016 | Seo | H01L 51/5004 |

* cited by examiner

*Primary Examiner* — John C Ingham
(74) *Attorney, Agent, or Firm* — Wang Law Firm, Inc.

(57) ABSTRACT

An organic light-emitting diode fluorescent device includes an anode layer, a hole injection layer, an emissive layer, an electron injection layer, and a cathode layer. A confinement layer is disposed on at least one of an upper face and a lower face of the emissive layer. The confinement layer has a triplet energy level higher than a triplet energy level of the emissive layer. A method for producing the organic light-emitting diode fluorescent device includes providing an anode substrate as an anode layer and disposing a hole injection layer, an emissive layer, an electron injection layer, and a cathode layer on the anode layer in sequence. A confinement layer is disposed on at least one of an upper face and a lower face of the emissive layer while producing the emissive layer. The confinement layer has a triplet energy level higher than a triplet energy level of the emissive layer.

18 Claims, 2 Drawing Sheets

ORGANIC LIGHT-EMITTING DIODE FLUORESCENT DEVICE AND METHOD FOR PRODUCING SAME

BACKGROUND OF THE INVENTION

The present invention relates to the field of display devices and, more particularly, to an organic light-emitting diode fluorescent device and a method for producing the organic light-emitting diode fluorescent device.

Organic light-emitting diodes (OLEDs) have received wide attention from the scientific society and the industries in recent years and OLED displays have entered the lives of people. The OLED display industry use organic material to accomplish the purpose of illuminating light of different colors, wherein red light devices and green light devices generally use phosphorescent material to achieve 100% internal quantum efficiency, while blue light devices still require much improvement in illuminating efficiency and service life as well as other aspects. The phosphorescent material responsible for blue light has a shorter service life, conventional blue light OLED devices generally use fluorescent system. However, the internal quantum efficiency of the fluorescent system is only 25%, and the remaining 75% of energy so generated is wasted, leading to a poor light emitting efficiency. Thus, it is an urgent issue to improve the efficiency and stability of the blue light devices.

BRIEF SUMMARY OF THE INVENTION

An objective of the present invention is to provide an organic light-emitting diode fluorescent device and a method for producing the organic light-emitting diode fluorescent device to fix the disadvantages of low internal quantum efficiency and poor light emitting efficiency of devices using fluorescent material.

In an aspect, an organic light-emitting diode fluorescent device includes an anode layer, a hole injection layer, an emissive layer, an electron injection layer, and a cathode layer. A confinement layer is disposed on at least one of an upper face and a lower face of the emissive layer. The confinement layer has a triplet energy level higher than a triplet energy level of the emissive layer.

In an example, the confinement layer includes a first confinement layer disposed on the upper face of the emissive layer. The first confinement layer is capable of transporting electrons and serves as an electron transport layer.

In another example, the confinement layer includes a first confinement layer disposed on the upper face of the emissive layer, and an electron transport layer is disposed between the first confinement layer and the electron injection layer.

The hole injection layer can have a hole injection capability larger than a hole injection capability of the electron injection layer.

In a further example, the confinement layer includes a second confinement layer disposed on the lower face of the emissive layer, and the second confinement layer is capable of transporting holes and serves as a hole transport layer.

In still another example, the confinement layer includes a second confinement layer disposed on the lower face of the emissive layer, and a hole transport layer is disposed between the second confinement layer and the hole injection layer.

In yet another example, the confinement layer includes a second confinement layer disposed on the lower face of the emissive layer, and the hole injection layer has a hole injection capability smaller than a hole injection capability of the electron injection layer.

The material for the confinement layer includes TCTA (4,4',4"-Tris(carbazol-9-yl)triphenylamine) or PO14 (2,8-Bis-(diphenylphosphinoyl)dibenzofuran).

In another aspect, a method for producing the organic light-emitting diode fluorescent device includes providing an anode substrate as an anode layer and disposing a hole injection layer, an emissive layer, an electron injection layer, and a cathode layer on the anode layer in sequence. The method further includes disposing a confinement layer on at least one of an upper face and a lower face of the emissive layer while producing the emissive layer. The confinement layer has a triplet energy level higher than a triplet energy level of the emissive layer.

In an example, disposing the confinement layer includes disposing a first confinement layer on the upper face of the emissive layer. The first confinement layer is located between the electron injection layer and the emissive layer. The first confinement layer is capable of transporting electrons and serves as an electron transport layer.

In another example, disposing the confinement layer includes disposing a first confinement layer on the upper face of the emissive layer and disposing an electron transport layer between the first confinement layer and the electron injection layer.

The hole injection layer can have a hole injection capability larger than a hole injection capability of the electron injection layer.

In a further example, disposing the confinement layer includes disposing a second confinement layer on the lower face of the emissive layer. The second confinement layer is located between the hole injection layer and the emissive layer. The second confinement layer is capable of transporting holes and serves as a hole transport layer.

In still another example, disposing the confinement layer includes disposing a second confinement layer on the lower face of the emissive layer and disposing a hole transport layer between the second confinement layer and the hole injection layer.

In yet another example, disposing the confinement layer includes disposing a second confinement layer on the lower face of the emissive layer. The hole injection layer has a hole injection capability smaller than a hole injection capability of the electron injection layer.

The material for the confinement layer can be TCTA (4,4',4"-Tris(carbazol-9-yl)triphenylamine) or PO14 (2,8-Bis-(diphenylphosphinoyl)dibenzofuran).

The present invention will become clearer in light of the following detailed description of illustrative embodiments of this invention described in connection with the drawings.

DETAILED DESCRIPTION OF THE INVENTION

Figure 1:
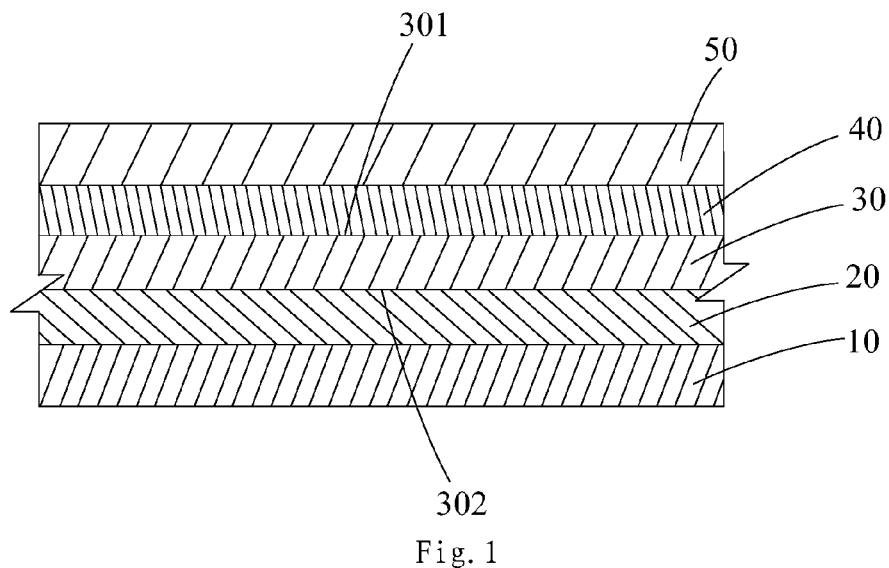
FIG. 1 is a diagrammatic cross sectional view of a conventional organic light-emitting diode in which a hole transport layer and an electron transport layer are omitted.

FIG. 1 is diagrammatic cross sectional view of a conventional organic light-emitting diode (OLED) device in which a hole transport layer and an electron transport layer are omitted. The conventional OLED device includes an anode layer 10, a hole injection layer 20, an emissive layer 30, an electron injection layer 40, and a cathode layer 50.

An OLED fluorescent device according to preferred embodiment of the present invention includes a confinement layer disposed on at least one of an upper face and a lower face of the emissive layer 30. The confinement layer has a triplet energy level higher than a triplet energy level of the emissive layer 30, such that the triplet excitons are confined in the emissive layer 30. The triplet excitons combine with each other to form singlet excitons to thereby obtain a fluorescence spectrum, improving the internal quantum efficiency of the fluorescent device. In an example, two confinement layers are respectively disposed on the upper and lower faces of the emissive layer 30, and the triplet energy level of each confinement layer is higher than the triplet energy level of the emissive layer 30, more effectively confining the triplet excitons in the emissive layer 30 to further improve the efficiency of the fluorescent device.

In another example, a confinement layer can be disposed on only one of the upper and lower faces of the emissive layer 30 according to the structure of the OLED fluorescent device. As an example, when the light emitting area in the emissive layer 30 is adjacent to the anode (namely, the hole injection capability of the hole injection layer 20 is smaller than the hole injection capability of the electron injection layer 40), a confinement layer can be disposed between the emissive layer 30 and the hole injection layer 20 (i.e., the lower face of the emissive layer 30). In another case that the light emitting area in the emissive layer 30 is adjacent to the cathode (namely, the hole injection capability of the hole injection layer 20 is larger than the hole injection capability of the electron injection layer 40), a confinement layer can be disposed between the emissive layer 30 and the electron injection layer 40 (i.e., the upper face of the emissive layer 30). Disposing a confinement layer on only one of the upper and lower faces of the emissive layer 30 can simplify the structure of the fluorescent device while improving the efficiency of the fluorescent device. Embodiments of the OLED fluorescent device and the method for producing the embodiments of the OLED fluorescent device will be set forth hereinafter.

The conventional OLED includes, from bottom to top, an anode layer 10, a hole injection layer 20, an emissive layer 30, an electron injection layer 40, and a cathode layer 50, as shown in FIG. 1. The emissive layer 30 includes an upper face 301 and a lower face 302. The upper face 301 is bonded to the electron injection layer 40. The lower face 302 is bonded to the hole injection layer 20.

The organic light-emitting diode fluorescent device according to the present invention is constructed based on the above structure. A confinement layer is disposed on at least one of the upper face 301 and the lower face 302 of the emissive layer 30. In different embodiments, the confinement layer is disposed on the upper face 301 of the emissive layer 30, on the lower face 302 of the emissive layer 30, and on each of the upper face 301 and the lower face 302 of the emissive layer 30, respectively. The triplet energy level of the confinement layer is higher than the triplet energy level of the emissive layer 30 to confine the triplet excitons in the emissive layer 30. The triplet excitons combine with each other to form singlet excitons to thereby obtain a delayed fluorescence spectrum, improving the internal quantum efficiency of the fluorescent device and improving the light emitting efficiency of the fluorescent device.

The confinement layer is a triplet exciton confinement layer (TECL). The material for the confinement layer can be 4,4',4''-Tris(carbazol-9-yl)triphenylamine (TCTA) or 2,8-Bis-(diphenylphosphinoyl)dibenzofuran (PO14). The material characteristics of the above materials are shown in Table 1.

TABLE 1

| Material Characteristics Parameters of TCTA and P014 | | | |
|---|---|---|---|
| TECL material | highest occupied molecular orbit | lowest unoccupied molecular orbit | triplet energy level |
| TCTA | −5.1 | −1.7 | 2.9 |
| P014 | −6.5 | −2.5 | 3.1 |

Combination of the triplet excitons forming the singlet excitons fulfills the following Equation (1):

$$^3A^* + {}^3A^* \rightarrow (4/9)^1A + (1/9)^1A^* + (13/9)^3A^* \qquad (1)$$

wherein $^3A^*$ is a triplet exciton and $^1A^*$ is a singlet exciton.

As can be seen from Equation (1), five (5) triplet excitons can generate a singlet exciton. The original internal quantum efficiency of the fluorescent device is 25%, and the remaining 75% of triplet excitons cannot emit light. By disposing the confinement layer to confine the triplet excitons in the emissive layer 30 such that the triplet excitons combine with each other to form singlet excitons capable of emitting light, the 75% of triplet excitons can be converted into 15% of singlet excitons, increasing the internal quantum efficiency from 25% to 40%. Thus, the efficiency of the OLED fluorescent device is increased by 60%.

Figure 2:
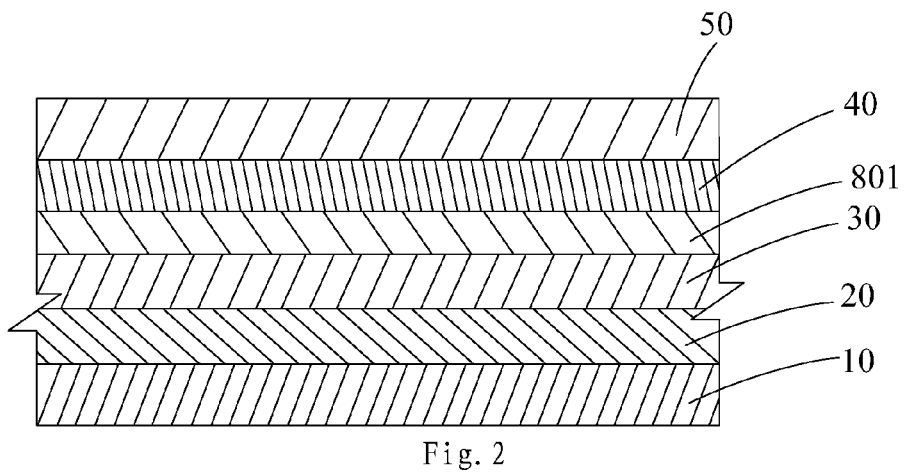
FIG. 2 is a diagrammatic cross sectional view of an organic light-emitting diode fluorescent device of a first embodiment according to the present invention.

FIG. 2 is a diagrammatic cross sectional view of an OLED fluorescent device fluorescent device of a first embodiment according to the present invention. In this embodiment, the OLED fluorescent device includes an anode layer 10, a hole injection layer 20, an emissive layer 30, a first confinement layer 801, an electron injection layer 40, and a cathode layer 50 in sequence. The first confinement layer 801 is located between the electron injection layer 40 and the emissive layer 30 and is disposed on the upper face 301 of the emissive layer 30. The first confinement layer 801 is capable of transporting electrons and serves as an electron transport layer. The triplet energy level of the first confinement layer 801 is higher than the triplet energy level of the emissive layer 30. In this embodiment, the hole injection capability of the hole injection layer 20 is larger than the hole injection capability of the electron injection layer 40; namely, the light emitting area of the emissive layer 30 is adjacent to the cathode. A suitable material for an electron transport layer is selected as the material for the first confinement layer 801, has a triplet energy level higher than the triplet energy level of the emissive layer 30, and is capable of transporting electrons. The first confinement layer 801 can be made of PO14 (2,8-Bis-(diphenylphosphinoyl)dibenzofuran). In a preferred example of this embodiment, an electron transport layer is disposed between the first confinement layer 801 and the electron injection layer 40. In this case, the material for the first confinement layer 801 can only fulfill the requirement of having a triplet energy level higher than the triplet energy level of the emissive layer 30. The electron transport capability is not required.

Figure 3:
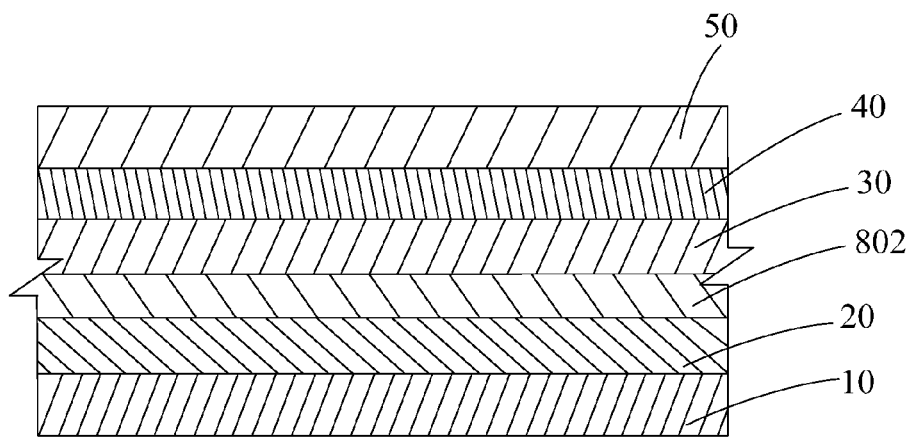
FIG. 3 is a diagrammatic cross sectional view of an organic light-emitting diode fluorescent device of a second embodiment according to the present invention.

FIG. 3 is a diagrammatic cross sectional view of an organic light-emitting diode fluorescent device of a second embodiment according to the present invention. In the second embodiment, the OLED fluorescent device includes an anode layer 10, a hole injection layer 20, a second confinement layer 802, an emissive layer 30, an electron injection layer 40, and a cathode layer 50 in sequence. The second confinement layer 802 is located between the hole injection layer 20 and the emissive layer 30 and is disposed on the lower face 302 of the emissive layer 30. The second confinement layer 802 is capable of transporting holes and serves as a hole transport layer. The triplet energy level of the second confinement layer 802 is higher than the triplet energy level of the emissive layer 30. In this embodiment, the hole injection capability of the hole injection layer 20 is smaller than the hole injection capability of the electron injection layer 40; namely, the light emitting area of the emissive layer 30 is adjacent to the anode. A suitable material for a hole transport layer is selected as the material for the second confinement layer 802, has a triplet energy level higher than the triplet energy level of the emissive layer 30, and is capable of transporting holes. The second confinement layer 802 can be made of TCTA (4,4',4"-Tris(carbazol-9-yl)triphenylamine). In a preferred example of this embodiment, a hole transport layer is disposed between the second confinement layer 802 and the hole injection layer 20. In this case, the material for the second confinement layer 802 can only fulfill the requirement of having a triplet energy level higher than the triplet energy level of the emissive layer 30. The hole transport capability is not required.

Figure 4:
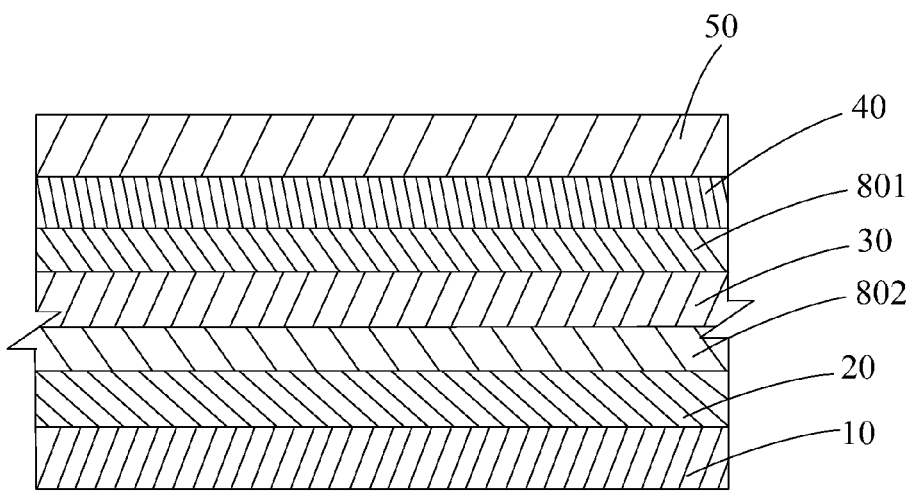
FIG. 4 is a diagrammatic cross sectional view of an organic light-emitting diode fluorescent device of a third embodiment according to the present invention.

FIG. 4 is a diagrammatic cross sectional view of an organic light-emitting diode fluorescent device of a third embodiment according to the present invention. In the third embodiment, the OLED fluorescent device includes an anode layer 10, a hole injection layer 20, a second confinement layer 802, an emissive layer 30, a first confinement layer 801, an electron injection layer 40, and a cathode layer 50 in sequence. The first confinement layer 801 and the second confinement layer 802 are respectively disposed on the upper and lower faces 301 and 302 of the emissive layer 30. The triplet energy level of each of the first and second confinement layers 801 and 802 is higher than the triplet energy level of the emissive layer 30. The first confinement layer 801 is capable of transporting electrons and serves as an electron transport layer. The second confinement layer 802 is capable of transporting holes and serves as a hole transport layer. A suitable material for an electron transport layer is selected as the material for the first confinement layer 801, has a triplet energy level higher than the triplet energy level of the emissive layer 30, and is capable of transporting electrons. The first confinement layer 801 can be made of PO14 (2,8-Bis-(diphenylphosphinoyl)dibenzofuran). A suitable material for a hole transport layer is selected as the material for the second confinement layer 802, has a triplet energy level higher than the triplet energy level of the emissive layer 30, and is capable of transporting holes. The second confinement layer 802 can be made of TCTA (4,4',4"-Tris(carbazol-9-yl)triphenylamine).

Figure 5:
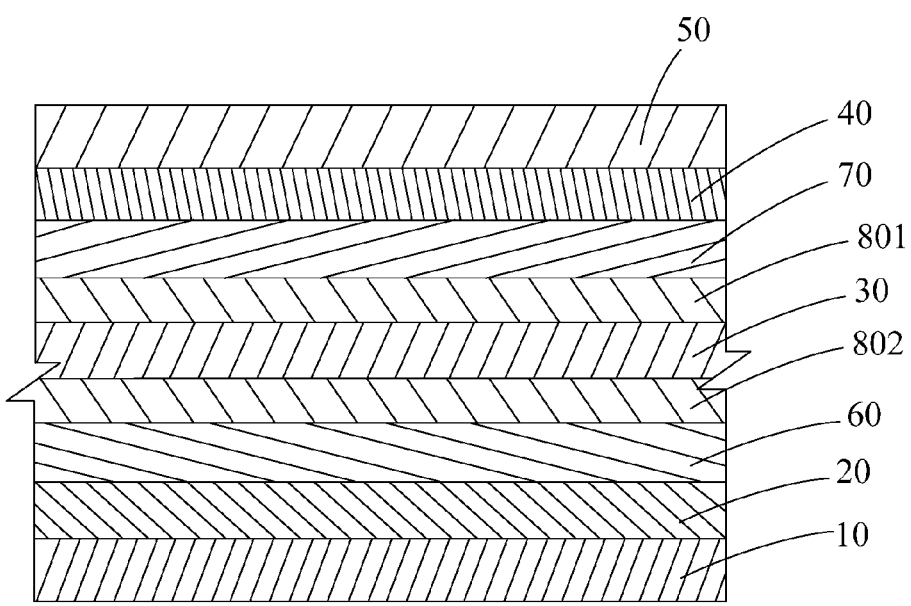
FIG. 5 is a diagrammatic cross sectional view of an organic light-emitting diode fluorescent device of a fourth embodiment according to the present invention.

FIG. 5 is a diagrammatic cross sectional view of an organic light-emitting diode fluorescent device of a fourth embodiment according to the present invention. In the fourth embodiment, the OLED fluorescent device includes an anode layer 10, a hole injection layer 20, a hole transport layer 60, a second confinement layer 802, an emissive layer 30, a first confinement layer 801, an electron transport layer 70, an electron injection layer 40, and a cathode layer 50 in sequence. The first confinement layer 801 and the second confinement layer 802 are respectively disposed on the upper and lower faces of the emissive layer 30. The triplet energy level of each of the first and second confinement layers 801 and 802 is higher than the triplet energy level of the emissive layer 30.

The advantageous effects of the OLED fluorescent device according to the present invention include:

The OLED fluorescent device according to the present invention is suitable for fluorescent device systems including red, green, and blue light fluorescent devices.

By disposing the confinement layer 801, 802 (having a triplet energy level higher than the triplet energy level of the emissive layer 30) on the emissive layer 30 to confine the triplet excitons in the emissive layer 30, the combination possibility of the triplet excitons is increased such that the triplet excitons combine with each other to form singlet excitons, thereby obtaining a fluorescence spectrum. Thus, the internal quantum efficiency of the fluorescent device is increased from 25% to 40%, and the efficiency of the fluorescent device is increased by 60%.

The materials of the confinement layers 801 and 802 can be selected to include the capability of transporting electrons and holes to simplify the structure of the device without adversely affecting the light emitting function of the fluorescent device.

A method for producing the embodiments of the OLED fluorescent device will now be set forth.

With reference to FIG. 1, the method for producing an organic light-emitting diode fluorescent device includes providing an anode substrate as an anode layer 10 and disposing a hole injection layer 20, an emissive layer 30, an electron injection layer 40, and a cathode layer 50 on the anode layer 10 in sequence. A confinement layer is disposed on at least one of an upper face 301 and a lower face 302 of the emissive layer 30 while producing the emissive layer 30. The confinement layer has a triplet energy level higher than a triplet energy level of the emissive layer 30.

In an example, the confinement layer is disposed on the upper face 301 of the emissive layer 30 and is disposed between the emissive layer 30 and the electron injection layer 40. In another example, the confinement layer is disposed in the lower face 302 of the emissive layer 30 and is disposed between the hole injection layer 20 and the emissive layer 30. In a further example, a confinement layer is disposed on each of the upper and lower faces 301 and 302 of the emissive layer 30. The confinement layer has a triplet energy level higher than a triplet energy level of the emissive layer 30, such that the triplet excitons are confined in the emissive layer 30. The triplet excitons combine with each other to form singlet excitons to thereby obtain a fluorescence spectrum, improving the internal quantum efficiency of the fluorescent device and improving the light emitting efficiency of the fluorescent device. The material for the confinement layer can be TCTA (4,4',4"-Tris(carbazol-9-yl)triphenylamine) or PO14 (2,8-Bis-(diphenylphosphinoyl)dibenzofuran).

With reference to FIG. 2, in a first embodiment of the method according to the present invention, a first confinement layer 801 is disposed on the upper face 301 of the emissive layer 30. The first confinement layer 801 serves as an electron transport layer and is capable of transporting electrons. In this case, the hole injection capability of the hole injection layer 20 is larger than the hole injection capability of the electron injection layer 40. A suitable material for an electron transport layer is selected as the material for the first confinement layer 801, has a triplet energy level higher than the triplet energy level of the emissive layer 30, and is capable of transporting electrons. The first confinement layer 801 can be made of PO14 (2,8-Bis-(diphenylphosphinoyl)dibenzofuran). In a preferred example of this embodiment, an electron transport layer is disposed between the first confinement layer 801 and the electron injection layer 40. In this case, the material for the first confinement layer 801 can only fulfill the requirement of having a triplet energy level higher than the triplet energy level of the emissive layer 30.

With reference to FIG. 3, in a second embodiment of the method according to the present invention, a second confinement layer 802 is disposed on the lower face 302 of the emissive layer 30. The second confinement layer 802 serves as a hole transport layer and is capable of transporting holes. The hole injection capability of the hole injection layer 20 is smaller than the hole injection capability of the electron injection layer 40. A suitable material for a hole transport layer is selected as the material for the second confinement layer 802, has a triplet energy level higher than the triplet energy level of the emissive layer 30, and is capable of transporting holes. The second confinement layer 802 can be made of TCTA (4,4',4"-Tris(carbazol-9-yl)triphenylamine). In a preferred example of this embodiment, a hole transport layer is disposed between the second confinement layer 802 and the hole injection layer 20. In this case, the material for the second confinement layer 802 can only fulfill the requirement of having a triplet energy level higher than the triplet energy level of the emissive layer 30.

With reference to FIG. 4, in a third embodiment of the method according to the present invention, a first confinement layer 801 is disposed on the upper face 301 of the emissive layer 30, and a second confinement layer 802 is disposed on the lower face 302 of the emissive layer 30. The first confinement layer 801 is capable of transporting electrons and serves as an electron transport layer. The second confinement layer 802 is capable of transporting holes and serves as a hole transport layer. The materials for the first confinement layer 801 and the second confinement layer 802 can be selected in a manner mentioned above. In a preferred embodiment shown in FIG. 5, an electron transport layer 70 is disposed between the first confinement layer 801 and the electron injection layer 40, and a hole transport layer 60 is disposed between the second confinement layer 802 and the hole injection layer 20. In this case, the materials for the first confinement layer 801 and the second confinement layer 802 can only fulfill the requirement of having a triplet energy level higher than the triplet energy level of the emissive layer 30.

The advantageous effects of the method for producing an OLED fluorescent device according to the present invention include:

The method for producing an OLED fluorescent device according to the present invention is suitable for fluorescent device systems including red, green, and blue light fluorescent devices.

By disposing the confinement layer 801, 802 (having a triplet energy level higher than the triplet energy level of the emissive layer 30) on the emissive layer 30 to confine the triplet excitons in the emissive layer 30, the merge possibility of the triplet excitons is increased such that the triplet excitons combine with each other to form singlet excitons, thereby obtaining a fluorescence spectrum. Thus, the internal quantum efficiency of the fluorescent device is increased from 25% to 40%, and the efficiency of the fluorescent device is increased by 60%.

The materials of the confinement layers 801 and 802 can be selected to include the capability of transporting electrons and holes to simplify the structure of the fluorescent device without adversely affecting the light emitting function of the fluorescent device.

Thus since the illustrative embodiments disclosed herein may be embodied in other specific forms without departing from the spirit or general characteristics thereof, some of which forms have been indicated, the embodiments described herein are to be considered in all respects illustrative and not restrictive. The scope is to be indicated by the appended claims, rather than by the foregoing description, and all changes which come within the meaning and range of equivalency of the claims are intended to be embraced therein.

The invention claimed is:

1. In an organic light-emitting diode fluorescent device comprising an anode layer, a hole injection layer, an emissive layer, an electron injection layer, and a cathode layer, wherein the improvement comprises:
    a first confinement layer disposed between the cathode layer and the emissive layer and having a triplet energy level higher than a triplet energy level of the emissive layer,
    wherein the first confinement layer is disposed on an upper face of the emissive layer, and wherein the first confinement layer is capable of transporting electrons and serves as an electron transport layer.

2. The device as claimed in claim 1, wherein the first confinement layer is disposed on an upper face of the emissive layer, and wherein an electron transport layer is disposed between the first confinement layer and the electron injection layer.

3. The device as claimed in claim 2 further comprising a second confinement layer disposed on the lower face of the emissive layer; and a hole transport layer disposed between the second confinement layer and the hole injection layer.

4. The device as claimed in claim 1, wherein the hole injection layer has a hole injection capability larger than a hole injection capability of the electron injection layer.

5. The device as claimed in claim 1, further comprising a second confinement layer disposed on the lower face of the emissive layer, and wherein the second confinement layer is capable of transporting holes and serves as a hole transport layer.

6. The device as claimed in claim 1, further comprising a second confinement layer disposed on the lower face of the emissive layer, and wherein a hole transport layer is disposed between the second confinement layer and the hole injection layer.

7. The device as claimed in claim 1, further comprising a second confinement layer disposed on the lower face of the emissive layer, and wherein the hole injection layer has a hole injection capability smaller than an electron injection capability of the electron injection layer.

8. The device as claimed in claim 1, wherein a material for the confinement layer is 4,4',4"-Tris(carbazol-9-yl) triphenylamine or 2,8-Bis-(diphenylphosphinoyl) dibenzofuran.

9. The device as claimed in claim 1 further comprising a second confinement layer disposed on the lower face of the emissive layer, with the second confinement layer capable of transporting holes and serving as a hole transport layer.

10. A method for producing an organic light-emitting diode fluorescent device, the method comprising the steps of:
- providing an anode substrate as an anode layer;
- disposing a hole injection layer, an emissive layer, an electron injection layer, and a cathode layer on the anode layer in sequence;
- disposing a first confinement layer between the emissive layer and the cathode layer while producing the emissive layer, wherein the confinement layer has a triplet energy level higher than a triplet energy level of the emissive layer;
- wherein the first confinement layer disposing step includes disposing the first confinement layer on the upper face of the emissive layer, wherein the first confinement layer is located between the electron injection layer and the emissive layer, and wherein the first confinement layer is capable of transporting electrons and serves as an electron transport layer.

11. The method as claimed in claim 10, wherein the first confinement layer disposing step includes disposing the first confinement layer on the upper face of the emissive layer and disposing an electron transport layer between the first confinement layer and the electron injection layer.

12. The method as claimed in claim 10, wherein the hole injection layer has a hole injection capability larger than a hole injection capability of the electron injection layer.

13. The method as claimed in claim 10, further comprising the step of disposing a second confinement layer on the lower face of the emissive layer, wherein the second confinement layer is located between the hole injection layer and the emissive layer, and wherein the second confinement layer is capable of transporting holes and serves as a hole transport layer.

14. The method as claimed in claim 13, comprising disposing a hole transport layer between the second confinement layer and the hole injection layer.

15. The method as claimed in claim 10, further comprising the step of disposing a second confinement layer on the lower face of the emissive layer and disposing a hole transport layer between the second confinement layer and the hole injection layer.

16. The method as claimed in claim 15, wherein the second confinement layer is located between the hole injection layer and the emissive layer, and wherein the second confinement layer is capable of transporting holes and serves as a hole transport layer.

17. The method as claimed in claim 10, wherein the hole injection layer has a hole injection capability smaller than a hole injection capability of the electron injection layer.

18. The method as claimed in claim 10, wherein a material for the confinement layer is 4,4',4"-Tris(carbazol-9-yl) triphenylamine or 2,8-Bis-(diphenylphosphinoyl) dibenzofuran.

* * * * *